United States Patent
Chen et al.

(10) Patent No.: US 8,921,136 B2
(45) Date of Patent: Dec. 30, 2014

(54) SELF ALIGNED CONTACT FORMATION

(71) Applicant: Taiwan Semiconductor Manufacturing Co., Ltd., Hsin-Chu (TW)

(72) Inventors: Neng-Kuo Chen, Sinshih Township (TW); Shao-Ming Yu, Zhubei (TW); Gin-Chen Huang, New Taipei (TW); Chia-Jung Hsu, Dacheng Township (TW); Sey-Ping Sun, Hsinchu (TW); Clement Hsingjen Wann, Carmel, NY (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 90 days.

(21) Appl. No.: 13/743,523

(22) Filed: Jan. 17, 2013

(65) Prior Publication Data
US 2014/0197499 A1   Jul. 17, 2014

(51) Int. Cl.
| H01L 21/66 | (2006.01) |
| --- | --- |
| H01L 21/302 | (2006.01) |
| H01L 21/461 | (2006.01) |
| H01L 21/336 | (2006.01) |
| H01L 21/8238 | (2006.01) |
| H01L 21/00 | (2006.01) |
| H01L 23/29 | (2006.01) |
| H01L 29/76 | (2006.01) |
| H01L 29/66 | (2006.01) |
| H01L 27/088 | (2006.01) |
| H01L 29/788 | (2006.01) |
| H01L 21/02 | (2006.01) |
| H01L 29/78 | (2006.01) |

(52) U.S. Cl.
CPC .......... *H01L 21/02167* (2013.01); *H01L 29/78* (2013.01); *Y10S 438/975* (2013.01)
USPC ............ 438/32; 438/719; 438/257; 438/258; 438/259; 438/260; 438/261; 438/262; 438/263; 438/264; 438/265; 438/266; 438/267; 438/735; 438/691; 438/218; 438/229; 438/724; 438/725; 438/738; 438/740; 438/744; 438/201; 438/211; 438/462; 438/975; 257/788; 257/288; 257/270; 257/396; 257/315; 257/330; 257/336

(58) Field of Classification Search
USPC ......... 438/719, 257–267, 735, 691, 218, 229, 438/724–725, 738, 740, 744, 201, 211, 401, 438/462, 975; 257/788, 288, 270, 296, 315, 257/330, 336
See application file for complete search history.

(56) References Cited

U.S. PATENT DOCUMENTS 5,677,867 A * 10/1997 Hazani .................. 365/185.01
6,136,652 A * 10/2000 Hazani ........................ 438/260

(Continued)

*Primary Examiner* — Evan Pert
*Assistant Examiner* — Gustavo Ramallo
(74) *Attorney, Agent, or Firm* — Eschweiler & Associates, LLC

(57) ABSTRACT

The present disclosure relates to methods of forming a self-aligned contact and related apparatus. In some embodiments, the method forms a plurality of gate lines interspersed between a plurality of dielectric lines, wherein the gate lines and the dielectric lines extend in a first direction over an active area. One or more of the plurality of gate lines are into a plurality of gate line sections aligned in the first direction. One or more of the plurality of dielectric lines are cut into a plurality of dielectric lines sections aligned in the first direction. A dummy isolation material is deposited between adjacent dielectric sections in the first direction and between adjacent gate line sections in the first direction. One or more self-aligned metal contacts are then formed by replacing a part of one or more of the plurality of dielectric lines over the active area with a contact metal.

20 Claims, 13 Drawing Sheets

(56) References Cited

U.S. PATENT DOCUMENTS

| | | | |
|---|---|---|---|
| 6,403,494 B1 * | 6/2002 | Chu et al. | 438/719 |
| 6,893,917 B2 * | 5/2005 | Hsieh | 438/257 |
| 6,894,339 B2 * | 5/2005 | Fan et al. | 257/314 |
| 7,037,787 B2 * | 5/2006 | Fan et al. | 438/267 |
| 7,176,516 B2 * | 2/2007 | Hsieh | 257/314 |
| 7,675,105 B2 * | 3/2010 | Choi et al. | 257/315 |
| 7,939,408 B2 * | 5/2011 | Choi et al. | 438/257 |
| 8,455,932 B2 * | 6/2013 | Khakifirooz et al. | 257/288 |
| 8,598,630 B2 * | 12/2013 | Shen et al. | 257/202 |
| 2013/0015529 A1 * | 1/2013 | Zhong et al. | 257/369 |

* cited by examiner

SELF ALIGNED CONTACT FORMATION

BACKGROUND

The fabrication of integrated chips can be broadly broken into two main sections, a front-end-of-the-line and a back-end-of-the-line. Front-end-of-the-line fabrication includes the formation of devices (e.g., transistors, capacitors, resistors, etc.) within a semiconductor substrate. Back-end-of-the-line fabrication includes the formation of metal interconnect layers comprised within insulating dielectric material disposed above the semiconductor substrate. The metal interconnect layers electrically connect individual devices of the front-end-of-the-line to external pins of an integrated chip.

Front-end-of-the-line devices are typically connected to back-end-of-the-line metal interconnect layers by way of a contact (i.e., a via) that extends vertically between one or more areas of a device and a first metal interconnect layer. For example, MOS field effect transistors may comprise a source, drain, and gate that are connected to a back-end-of-the-line metal interconnect layer by way of separate contacts.

DETAILED DESCRIPTION

Figure 1:
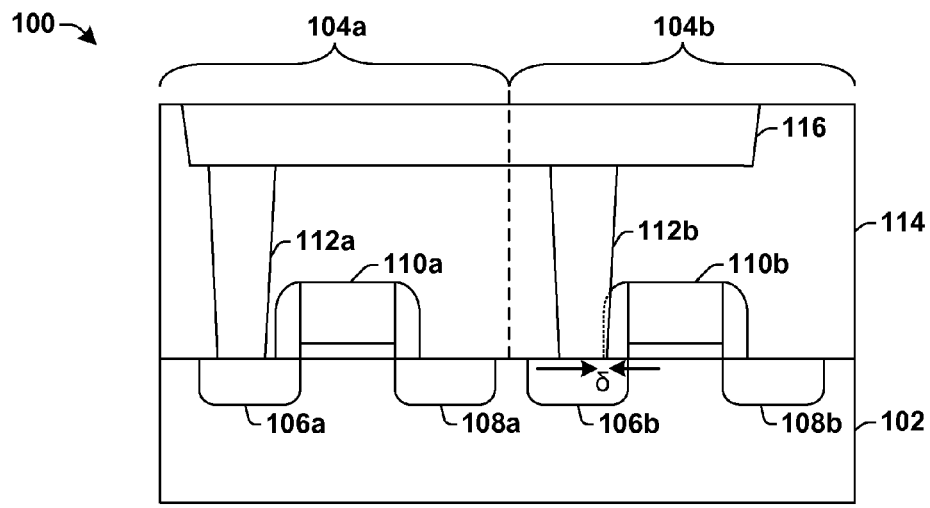
FIG. 1 shows a cross-sectional view of a semiconductor substrate illustrating contact misalignment.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

FIG. 1 illustrates a cross-sectional view 100 of an integrated chip comprising MOS field effect transistor (MOSFET) devices, 104a and 104b disposed within a semiconductor body 102. The MOSFET devices 104 have a source 106, a drain 108, and a gate 110, one or more of which are connected to a metal interconnect layer 116 by way of contacts 112. The contacts 112 are formed by lithographically patterning a hardmask, etching an inter-level dielectric material 114 according to the hardmask to form contact holes, and subsequently filling the contact holes with a metal material.

In modern technology nodes (e.g., 22 nm, 14 nm, etc.), the relatively small size of transistor devices requires a high degree of precision in contact etching to ensure a good electrical connection between a MOSFET device 104 and a back-end-of-the-line metal interconnect layer 116. For example, MOSFET device 104a comprises a properly aligned contact 112a, which provides a good electrical connection between source 106a and metal interconnect layer 116. Alternatively, MOSFET device 104b comprises contact 112b misaligned by 6. The misalignment causes a the contact 112b to overlay the gate 110b, resulting in a bad electrical connection between source 106b and metal interconnect layer 116 and damage to the gate 110b. As technology node dimensions decrease, the size of integrated chip components decreases, shrinking the lithography process window and causing misalignment, due to overlay shift variation, that increases the RC constant of contacts and potentially damages transistor device gates.

The present disclosure relates to methods of forming a self-aligned contact that mitigates contact etching misalignment and related apparatus. In some embodiments, a method comprises forming a plurality of gate lines interspersed between a plurality of dielectric lines, wherein the gate lines and the dielectric lines extend in a first direction over an active area. One or more of the plurality of gate lines are into a plurality of gate line sections aligned in the first direction. One or more of the plurality of dielectric lines are cut into a plurality of dielectric lines sections aligned in the first direction. A dummy isolation material is deposited between adjacent dielectric sections in the first direction and between adjacent gate line sections in the first direction. One or more self-aligned metal contacts are then formed by replacing a part of one or more of the plurality of dielectric lines over the active area with a contact metal. By forming the self-aligned metal contacts in place of the removed dielectric material, the metal contacts are do not subject to contact misalignment.

Figure 2:
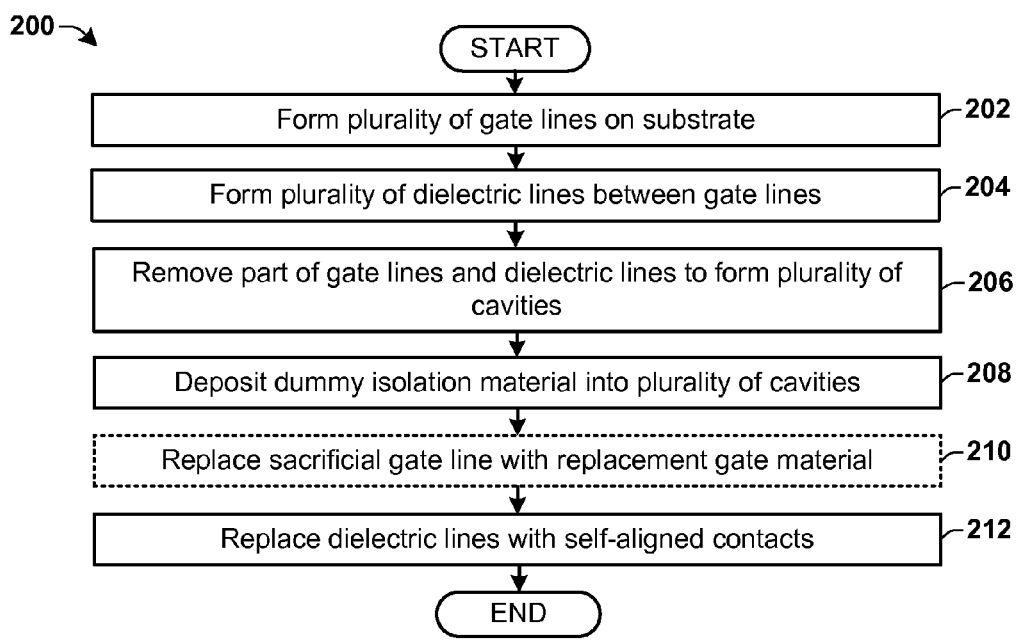
FIG. 2 is a flow diagram of some embodiments of a method of forming a self-aligned contact.

FIG. 2 is a flow diagram of some embodiments of a method 200 for forming a self-aligned contact for a semiconductor device.

At 202, a plurality of gate lines are formed on a substrate. The plurality of gate lines comprise a gate material that extends along a first direction over an active area comprising a highly doped region of a semiconductor substrate. In some embodiments, the gate lines comprise sacrificial gate lines (e.g., polysilicon lines) that are subsequently replaced with replacement high-k and/or metal gates.

At 204, a plurality of dielectric lines are formed around the plurality of sacrificial gate lines. The plurality of dielectric lines are formed at positions interspersed between the gate lines, and extend along the first direction to form alternating lines of gate material and dielectric material. In some embodiments, the plurality of dielectric lines comprise an oxide (e.g., $SiO_2$).

At 206, selective parts of the gate lines and dielectric lines are removed to form a plurality of cavities in the substrate. In some embodiments, the selective parts of the gate lines and dielectric lines are removed in areas external to the active area.

In some embodiments, selective parts of gate lines are removed (i.e., 'cut') according to a first cut mask and selective parts of dielectric lines are removed (i.e., 'cut') according to a second cut mask. The first cut mask 'cuts' the gate lines by removing gate material from selective areas of a pattern of the sacrificial gate defined by the first cut mask. For example, the first cut mask may be used in removing gate material from the gate lines, so that the gate lines are disjoint in the first direction, resulting in a plurality of contiguous gate line sections aligned in the first direction. The second cut mask 'cuts' the dielectric lines by removing dielectric material from selective areas of a pattern of dielectric lines defined by the second cut mask. For example, the second cut mask may be used in removing dielectric material from the dielectric lines, so that the dielectric lines are disjoint in the first-direction, resulting in a plurality of contiguous dielectric line sections aligned in the first direction.

At 208, a dummy isolation material is deposited into the plurality of cavities.

In some embodiments, the removed gate material is replaced with a first dummy isolation material, so as to deposit the first dummy isolation material between adjacent gates line sections in the first direction. The first dummy isolation material provides electrical isolation between self-aligned contacts in a second direction perpendicular to the first direction. For example, by replacing gate material with the first dummy isolation material, the gate lines are no longer conductive along the first direction between active areas, preventing electrical conduction between contacts by way of a conductive path in the second direction that travels through the sacrificial gate lines. Similarly, the removed dielectric material is replaced with a second dummy isolation material, so as to deposit the second dummy isolation material between adjacent dielectric line sections in the first direction. The second dummy isolation material provides for electrical isolation between contacts in the first direction. For example, by replacing dielectric material with the second dummy isolation material, the dielectric lines are no longer conductive along the second direction between active areas. In some embodiments, the first and dummy isolation materials comprise a same dummy isolation material (e.g., SiCN).

At 210, a part of one or more of the plurality gate lines are replaced with a replacement gate material over an active area, in some embodiments. For example, a part of one or more of the plurality gate lines may be replaced with a metal gate material such as aluminum.

At 212, a part of one or more of the plurality of dielectric lines are replaced with self-aligned contacts over the active area. The dielectric lines are replaced with self-aligned contacts between the gate material (e.g., between replacement metal gates). By replacing the dielectric lines with self-aligned contacts between the replacement metal gates, the resulting self-aligned contacts are automatically spaced apart from the replacement metal gates, thereby reducing misalignment of the self-aligned contacts. Furthermore, the first and second cut masks provide for isolation between adjacent self-aligned contacts in the first and second directions.

Figure 3A:
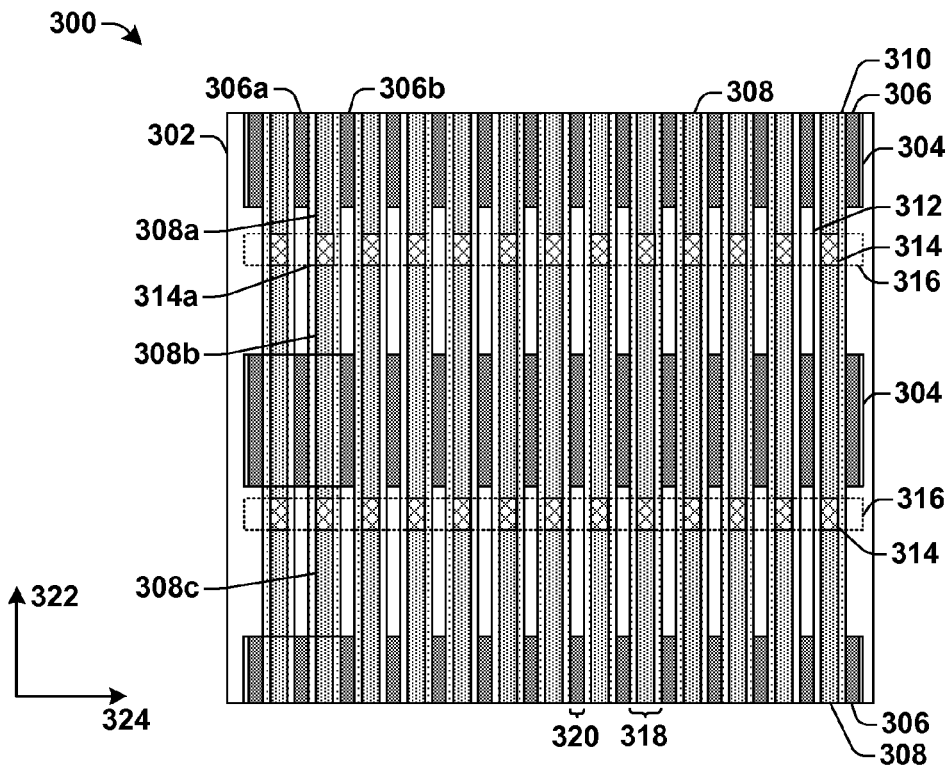
FIGS. 3A-3B illustrate top views of some embodiments of an integrated chip showing disclosed self-aligned contacts.
Figure 3B:
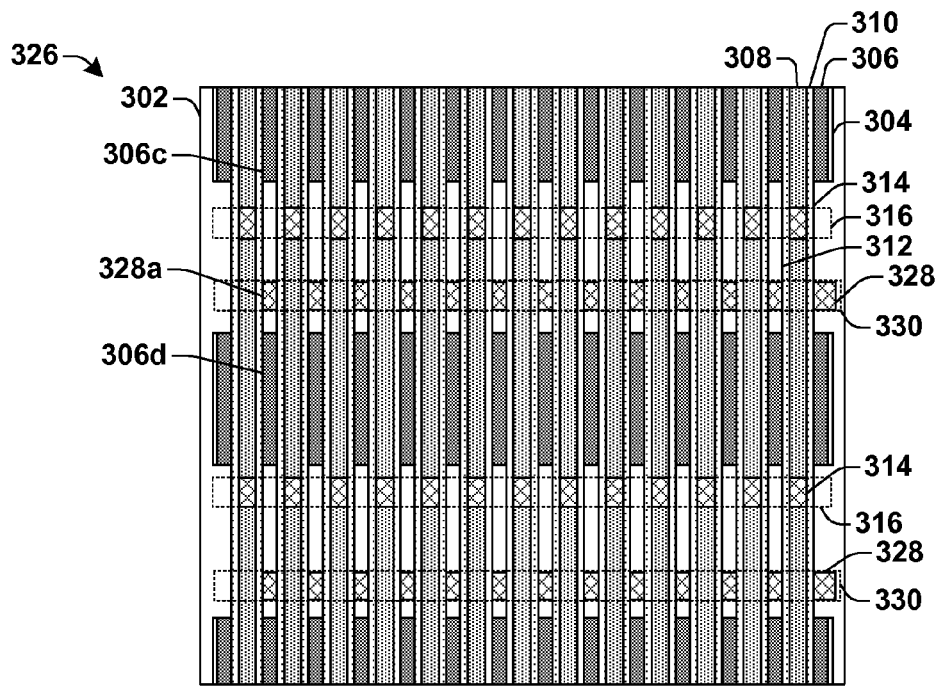

FIGS. 3A-3B illustrate top views, 300 and 326, of some embodiments of an integrated chip (IC) showing the disclosed self-aligned contacts.

As shown in top views, 300 and 326, a plurality of gate lines 308 extend in first rows 318 along a first direction 316. The gate lines 308 comprise a gate material (e.g., a high-k/metal replacement gate). In some embodiments, the gate lines 308 may further comprise a sacrificial gate material (e.g., polysilicon) along a portion of the gate lines (e.g., between active areas 304).

One or more of the plurality of gate lines 308 extend in the first direction 322, over an active area 304, to form one or more semiconductor devices having a gate, drain, and source. Self-aligned contacts 306 are located in second rows 320 between the gate lines 308 at positions over the active area 304 (i.e., on a drain and/or source of a semiconductor device). The self-aligned contacts 306 are separated from the gate lines 308 by a non-conductive spacer material 310. In some embodiments, the plurality of gate lines 308 are interspersed with a plurality of dielectric lines 312 that also extend in the first direction 316, within the second rows 320, between self-aligned contacts 306.

As shown in top view 300, gate lines 308 within a first row 318 are separated into multiple contiguous gate line sections 308a-308c separated by dummy isolation material 314 according to a first cut mask 316. For example, the first cut mask 316 cuts the gate lines 308 by removing gate material from the gate lines 308 in areas defined by the first cut mask 316. A dummy isolation material 314 is disposed into areas removed from the gate lines 308. The dummy isolation material 314a provides isolation between adjacent contacts 306 in a second direction 324 by preventing current from flowing from a first contact 306a to a second contact 306b by way of a conductive path along gate line section 308a.

As shown in top view 326, dummy isolation material 328, defined according to a second cut mask 330, separate self-aligned contacts 306 in the first direction 322. For example, the second cut mask 330 cuts the dielectric lines 312 by removing dielectric material from the dielectric lines 312 in an area defined by the second cut mask 330. A dummy isolation material 328 is disposed into areas removed from the dielectric lines 312. The dummy isolation material 328a provides isolation between adjacent self-aligned contacts 306 in the first direction 322 by preventing current from flowing from a first self-aligned contact 306c to a second self-aligned contact 306d.

Figure 4:
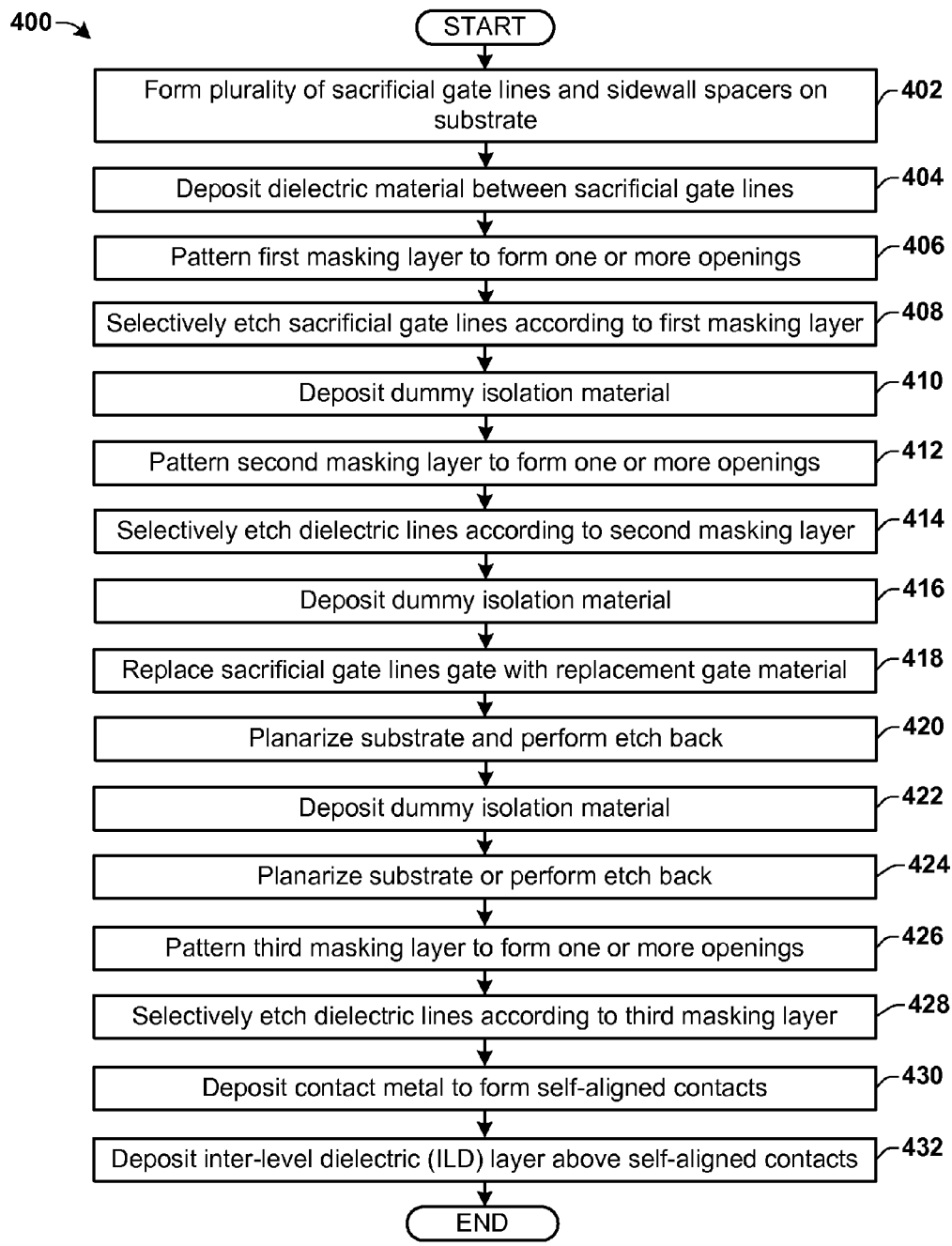
FIG. 4 is a flow diagram of some embodiments of a method of forming a self-aligned contact.

FIG. 4 is a flow diagram of some embodiments of a method 400 for forming a self-aligned contact for a semiconductor device.

While the disclosed methods (e.g., methods 200 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a plurality of sacrificial gate lines and sidewall spacers are formed on a substrate. The plurality of sacrificial gate lines are formed to extend along a first direction, while the sidewall spacers are formed alongside the sacrificial gate lines.

At 404, a dielectric material is deposited between the sacrificial gate lines, resulting in a plurality of dielectric lines extending in the first direction. In some embodiments, the substrate may be planarized after the dielectric material is deposited.

At 406, a first masking layer is patterned to expose the substrate at one or more openings. The one or more openings are located above a part of at least one of the plurality of sacrificial gate lines.

At 408, the substrate is selectively etched according to the first masking layer to remove gate material from the plurality of sacrificial gate lines at the one or more openings. Selectively etching the substrate to remove gate material from the plurality of sacrificial gate lines 'cuts' the sacrificial gate lines in the first direction, resulting in a plurality of cavities between adjacent gate line sections.

At 410, a dummy isolation material is deposited onto the substrate. The dummy isolation material fills the plurality of cavities. In some embodiments, the substrate may be planarized after the dummy isolation material is deposited.

At 412, a second masking layer is patterned to expose the substrate at one or more openings. The one or more openings are located above a part of at least one of the plurality of dielectric lines.

At 414, the substrate is selectively etched according to a second masking layer to remove dielectric material from a plurality of dielectric lines at one or more openings. Selectively etching the substrate to remove dielectric material from the plurality of dielectric lines 'cuts' the dielectric lines in the first direction, resulting in a plurality of cavities between adjacent dielectric line sections.

At 416, a dummy isolation material is deposited onto the substrate. The dummy isolation material fills the plurality of cavities. In some embodiments, the substrate may be planarized after the dummy isolation material is deposited.

At 418, a part of the sacrificial gate lines are replaced with a replacement gate material. The part of the sacrificial gate lines replaced with the replacement gate material is above the active area.

At 420, the substrate is planarized and the replacement gate material is etched back to a position below a top surface of the substrate.

At 422, a dummy isolation material is deposited onto the substrate. The dummy isolation material is deposited above the etched back replacement gate material.

At 424, the substrate may be planarized or the dummy isolation material may be etched back to a position below the surface of the substrate At 426, a third masking layer is patterned to expose the substrate at a one or more openings. The one or more openings are located above a part of at least one of the plurality of dielectric lines at a position above the active area and between replacement gate material.

At 428, the substrate is selectively etched according to the third masking layer to remove dielectric material from a plurality of dielectric lines at one or more openings. Removal of the dielectric material results in a plurality of contact holes in the substrate.

At 430, a contact metal is deposited onto the substrate. The contact metal fills the contact holes to form self-aligned contacts. In some embodiments, the substrate may be planarized after the contact metal is deposited to remove excess contact metal.

At 432, an inter-level dielectric (ILD) material is deposited onto the substrate above the self-aligned contacts.

FIGS. 5A-20 illustrate some embodiments of an integrated chip whereon a method of optimizing the area of a series connected gate (e.g., method 400) is implemented. Although FIGS. 5A-20 are described in relation to a method, it will be appreciated that the structures disclosed in claims 5A-20 are not limited to such a method. Rather, it will be appreciated that the illustrated structures of FIGS. 5A-20 provide for a structural description of a disclosed integrated chip apparatus, having one or more self aligned contacts, that is able to stand alone independent of a method of formation.

Figure 5A:
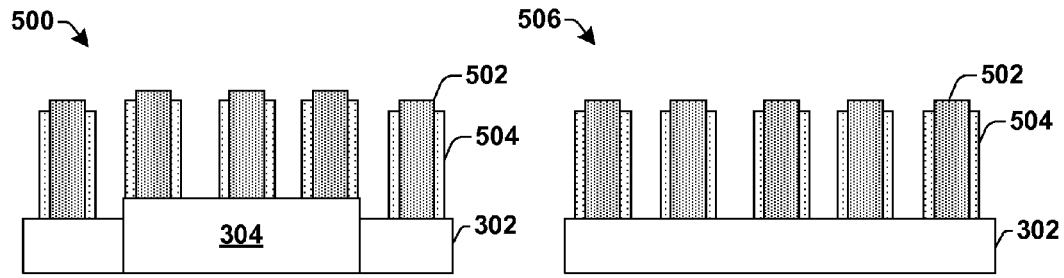
FIGS. 5A-20 illustrate some embodiments of an integrated chip whereon a method of optimizing the area of a series connected gate is implemented.

FIG. 5A illustrates cross-sectional views 500, 506 of some embodiments of an integrated chip corresponding to act 402. As shown in cross-sectional views 500 and 506, a plurality of sacrificial gate lines 502 are formed onto a substrate 302. The substrate 302 may comprise any type of semiconductor body (e.g., silicon, SiGe, SOI) such as a semiconductor wafer and/or one or more die on a wafer, as well as any other type of metal layer, device, semiconductor and/or epitaxial layers, etc., associated therewith.

Sidewall spacers 504 are formed at positions adjacent to the sacrificial gate lines 502. In various embodiments, the sidewall spacers 504 may comprise a dielectric material such as silicon nitride (SiN), for example, that abuts the sacrificial gate lines 502.

Figure 5B:
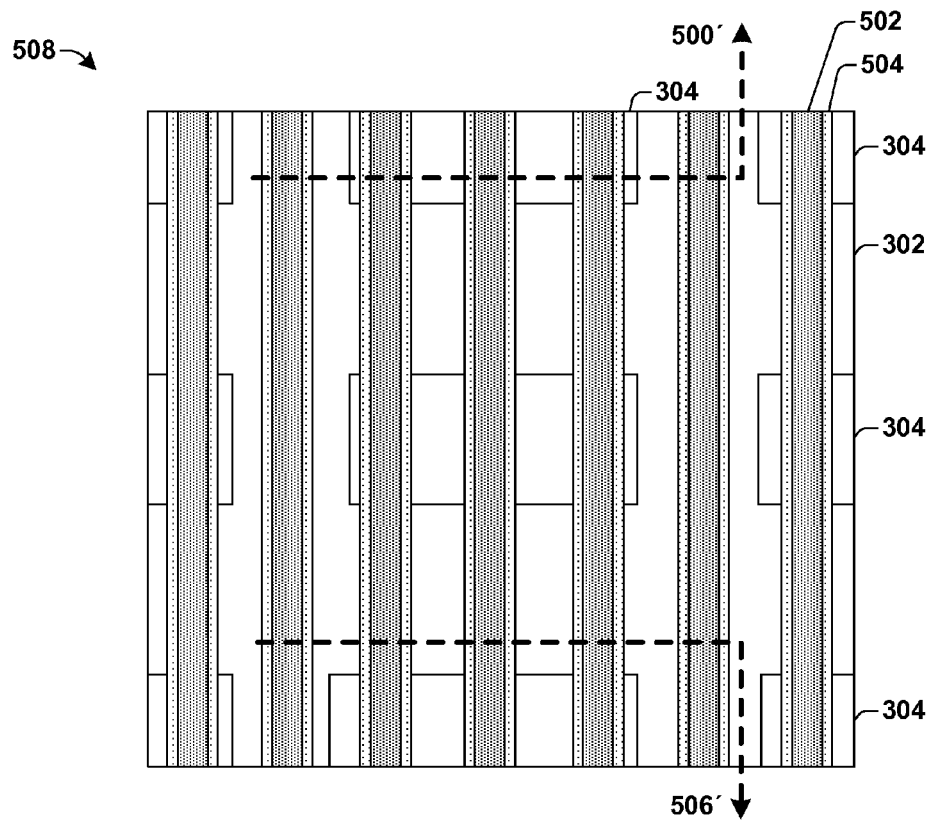

FIG. 5B illustrates a top view 508 of an integrated chip, corresponding to cross-sectional views 500 and 506. As shown in top view 508, the first cross-sectional view 500 corresponds to a cross-sectional line 500', which extends along an area of the substrate 302 that comprises an active area 304. The second cross-sectional view 506 corresponds to a cross-sectional line 506', which extends along an area of the substrate 302 that is between active areas 304.

Figure 6A:
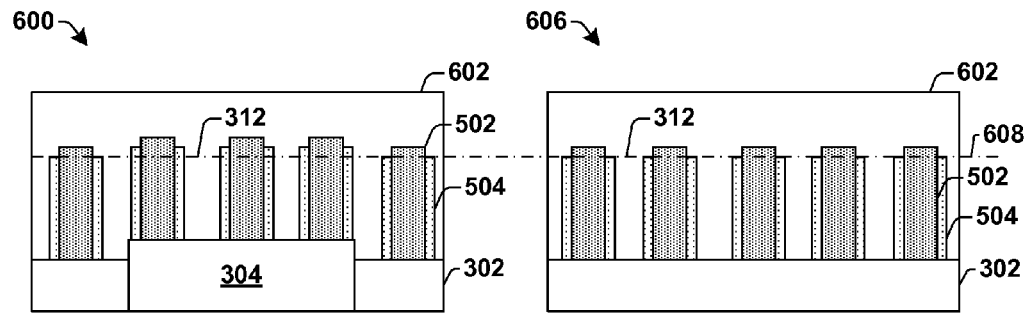

FIG. 6A illustrates cross-sectional views 600, 606 of an integrated chip corresponding to act 404. As shown in cross-sectional views 600 and 606, dielectric lines 312 are formed between sacrificial gate lines 502 by depositing a dielectric material 602 at a position that is between sacrificial gate lines 502. In various embodiments, the dielectric material 602 may be formed by a thermal process, deposition (e.g., PVD, CVD, etc.), or by a spin coating processes. In some embodiments, the dielectric material 602 may comprise a different material than the sidewall spacers 504. In some embodiments, the dielectric material 602 may comprise an oxide (e.g., SiO2) formed using, a deposition (e.g., PVD, CVD, etc.), a thermal growth, or a spin-on coating technique.

After the dielectric material 602 has been deposited, the substrate may be planarized. In some embodiments, a chemical mechanical polishing (CMP) process, which stops on the sacrificial gate lines 502, is performed to form a planar surface. The CMP process utilizes a combination of chemical and mechanical forces to remove material from a surface of a substrate, resulting in a substantially flat surface 608.

Figure 6B:
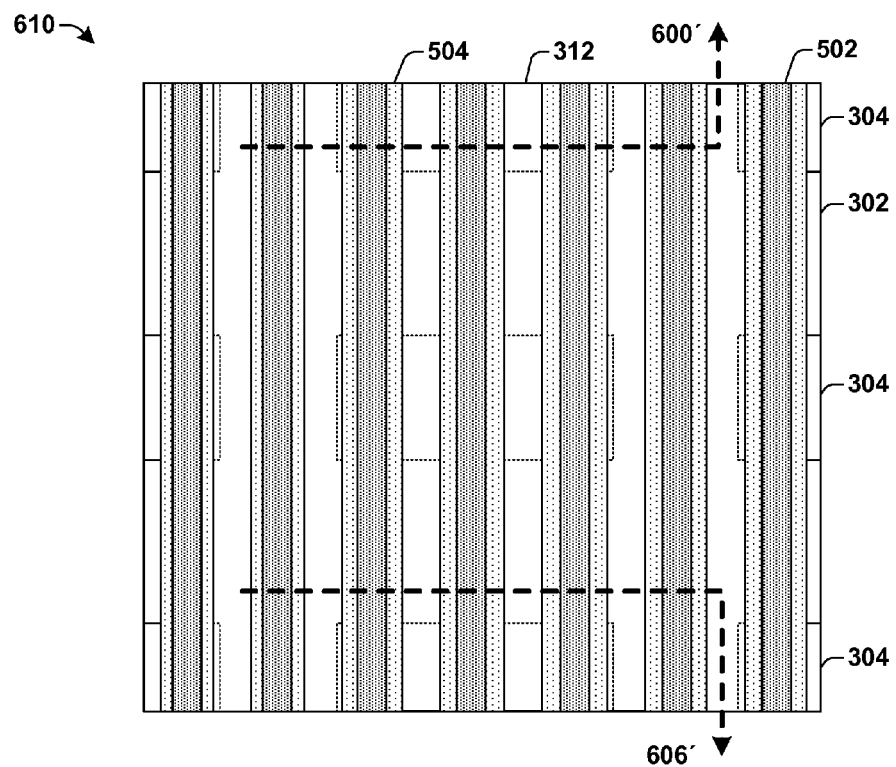

FIG. 6B illustrates a top view 610 of an integrated chip, corresponding to cross-sectional views 600 and 606 after planarization. As shown in top view 610, sacrificial gate lines 502 are interspersed between dielectric lines 312, resulting in a pattern having alternating sacrificial gate lines 502 and dielectric lines 312.

Figure 7:
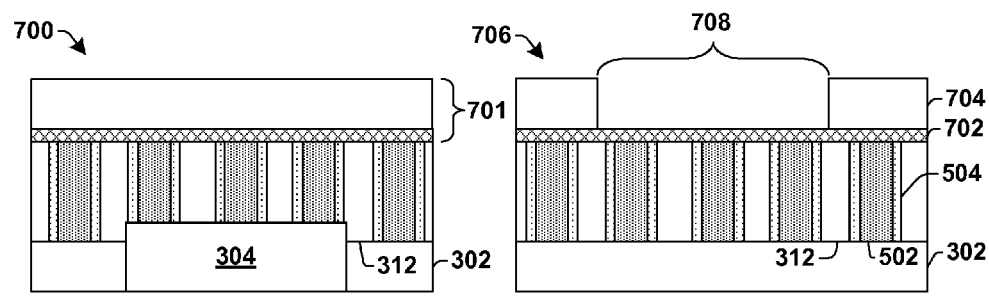

FIG. 7 illustrates cross-sectional views 700, 706 of an integrated chip corresponding to act 406. As shown in cross-sectional views 700 and 706, a first masking layer 701 is deposited above the sacrificial gate lines 502 and the dielectric lines 312. In some embodiments, the first masking layer 701 comprises a barrier layer 702 and a photoresist layer 704. The first masking layer 701 is patterned to have one or more openings 708 that selectively expose the underlying sacrificial gate lines 502 and the dielectric lines 312 in areas between the active areas 304, without exposing the underlying sacrificial gate lines 502 and the dielectric lines 312 in areas above the active areas 304.

In some embodiments, the barrier layer 702 may comprise a silicon carbon nitride (SiCN) layer deposited by way of deposition process (e.g., a physical vapor deposition such as sputtering) performed in a processing chamber held under vacuum. In some embodiments, the photoresist layer 704 may be spun onto the substrate by way of a spin coating process. The photoresist layer 704 is then patterned by a light source (e.g., an ultra-violet light source) and developed to form the one or more openings 708 that define a gate material cut area.

Figure 8:
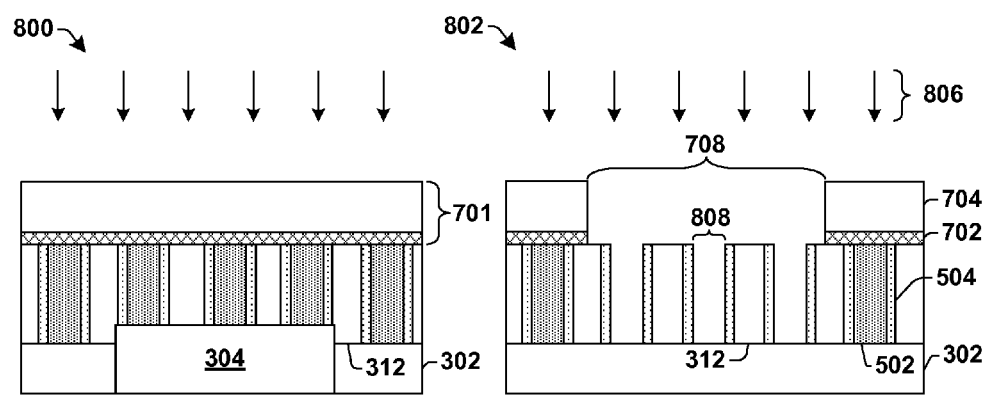

FIG. 8 illustrates cross-sectional views 800, 802 of an integrated chip corresponding to act 408. As shown in cross-sectional views 800 and 802, an etchant 806 is applied to the substrate. The etchant 806 may comprise a wet etchant or a dry etchant (e.g., Sulfur Hexafluoride). The etchant 806 selectively etches the substrate according to the masking layer to selectively remove sacrificial gate material from the sacrificial gate lines 502 at the one or more openings 708. Removal of the sacrificial gate material results in a plurality of cavities 808 that are disposed between positive reliefs of the dielectric lines 312.

Figure 9A:
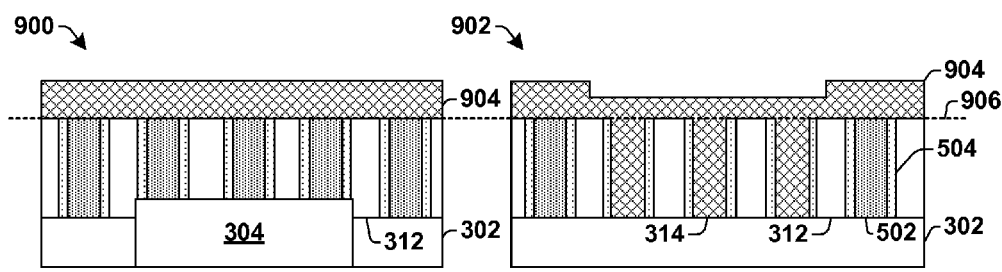

FIG. 9A illustrates cross-sectional views, 900 and 902, of an integrated chip corresponding to act 410. As shown in cross-sectional views 900 and 902, a dummy isolation material 904 is deposited onto the substrate. The dummy isolation material 904 fills the plurality of cavities 808 between the positive reliefs of the dielectric lines 312. In some embodiments, the dummy isolation material 904 may comprise silicon carbide nitride (SiCN) deposited by way of deposition process (e.g., a physical vapor deposition such as sputtering) performed in a processing chamber held under vacuum. After the dummy isolation material 904 has been deposited, a chemical mechanical polishing (CMP) process is performed to planarize the substrate, resulting in a substantially flat surface 906 that forms dummy isolation material 314 between adjacent gate line sections.

Figure 9B:
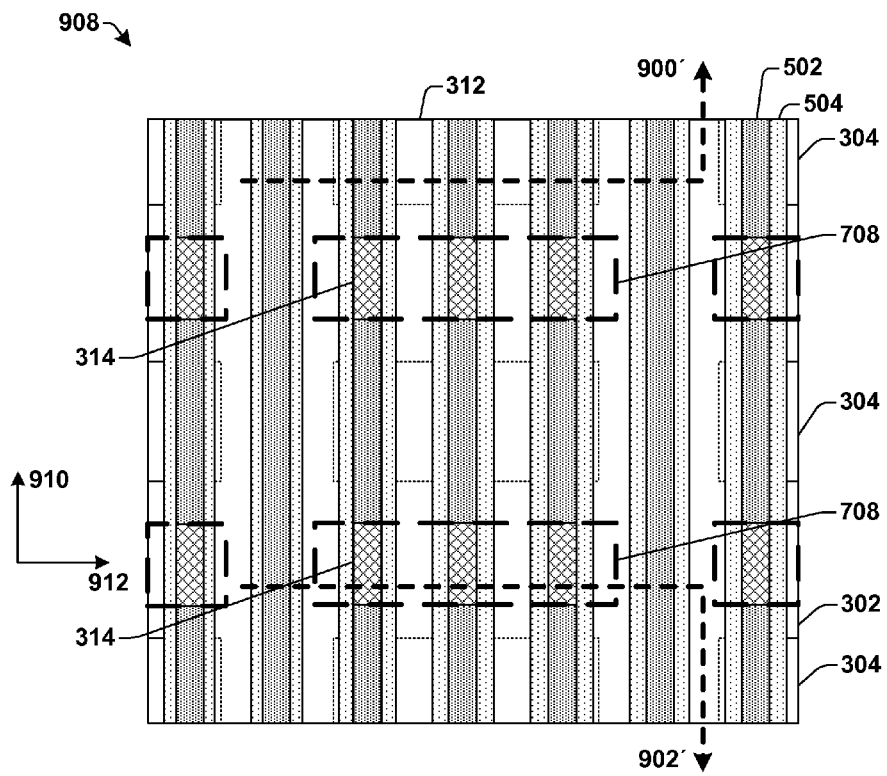

FIG. 9B is a top view of an integrated chip corresponding to cross-sectional views 900 and 902 after planarization. The one or more openings 708 are located along the second cross-sectional line 902'' (corresponding to cross-sectional view 902) so that sacrificial gate material is removed from sacrificial gate lines 502 at positions between active areas 304. By removing gate material from sacrificial gate lines 502 between active areas 304, subsequently formed self-aligned contacts are isolated in a second direction 912 perpendicular to a first direction along which the sacrificial gate lines 502 run. It will be appreciated the illustrated one or more openings 708 are an example of openings, and that in other examples the one or more openings 708 may vary in shape and size.

Figure 10:
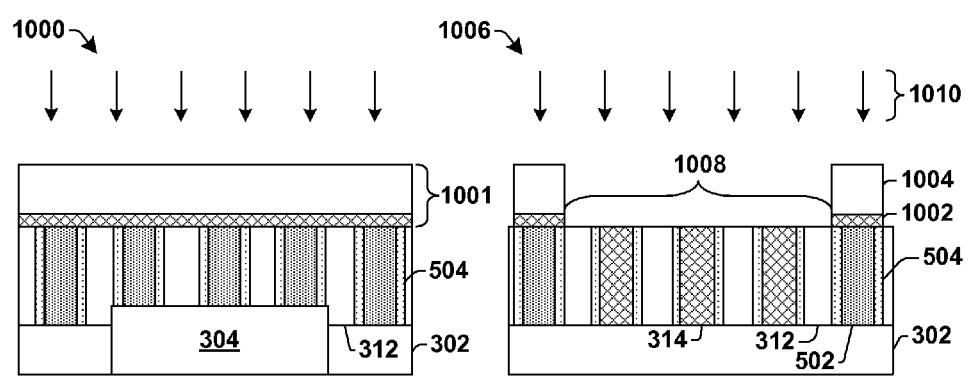

FIG. 10 illustrates cross-sectional views, 1000 and 1006, of an integrated chip corresponding to act 412. As shown in cross-sectional views 1000 and 1006, a second masking layer 1001 is deposited above the sacrificial gate lines 502 and the dielectric lines 312. In some embodiments, the second masking layer 1001 comprises a barrier layer 1002 and a photoresist layer 1004. The second masking layer 1001 is patterned to have one or more openings 1008 that expose the sacrificial gate lines 502 and the dielectric lines 312 in areas between the active areas 304, without exposing the sacrificial gate lines 306 and the dielectric lines 312 above the active areas 304.

In some embodiments, the barrier layer 1002 may comprise a SiCN layer deposited by way of deposition process (e.g., a physical vapor deposition such as sputtering) performed in a processing chamber held under vacuum. In some embodiments, the photoresist layer 1004 may be spun onto the substrate by way of a spin coating process. The photoresist layer 1004 is then patterned by a light source and developed to form the one or more openings 1008 that define a dielectric cut area.

Figure 11:
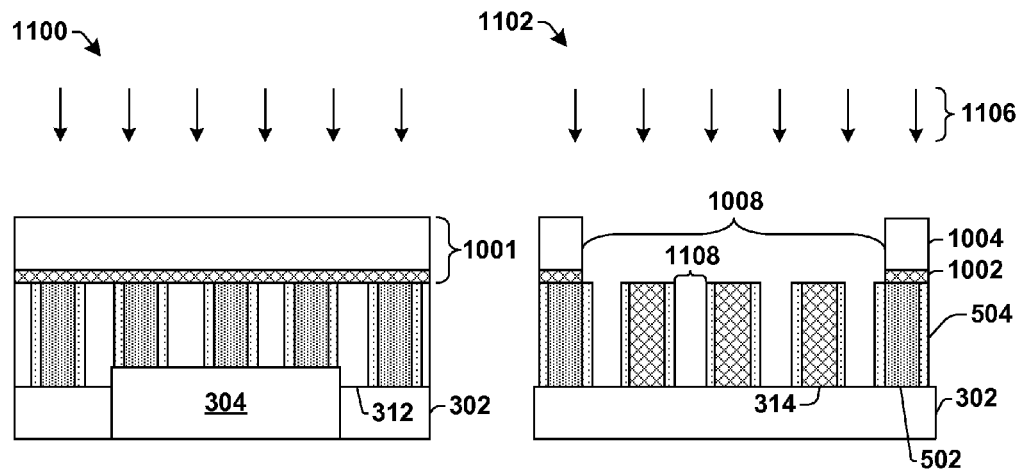

FIG. 11 illustrates cross-sectional views 1100 and 1102, of an integrated chip corresponding to act 414. As shown in cross-sectional views 1100 and 1102, an etchant 1106 is applied to the substrate. The etchant 1106 selectively etches the substrate according to the masking layer to selectively remove dielectric material from the dielectric lines 312 at the one or more openings 1008. Removal of the dielectric material results in a plurality of cavities 1108 that are disposed between positive reliefs of dummy isolation material 904. In some embodiments, the substrate may be selectively etched using a dry etch comprising an etchant comprising $CF_4$ or using a wet etch comprising an etchant comprising KOH, for example.

Figure 12A:
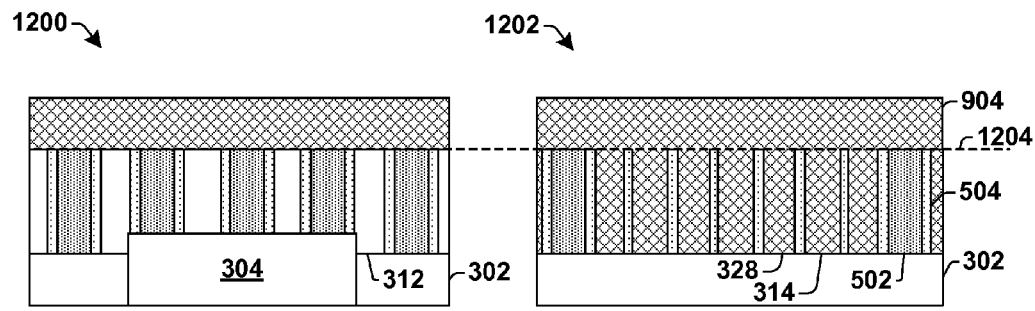

FIG. 12A illustrates cross-sectional views, 1200 and 1202, of an integrated chip corresponding to act 416. As shown in cross-sectional view 1200 and 1202, a dummy isolation material 904 is deposited onto the substrate. The dummy isolation material 904 fills the plurality of cavities 1108 between the positive reliefs of the dummy isolation material 904. In some embodiments, the dummy isolation material 904 may comprise silicon carbide nitride (SiCN) deposited by way of deposition process (e.g., a physical vapor deposition such as sputtering). After the dummy isolation material 904 has been deposited, a chemical mechanical polishing (CMP) process is performed to planarize the substrate, resulting in a substantially flat surface 1206 that forms dummy isolation material 328 between dielectric line sections.

Figure 12B:
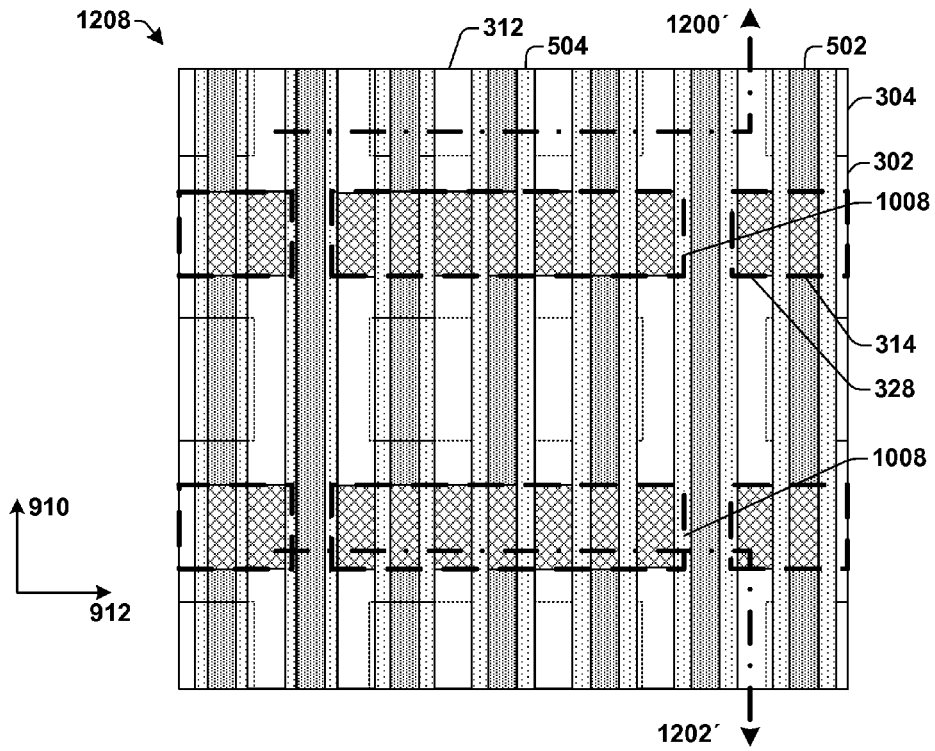

FIG. 12B is a top view 1208 of an integrated chip corresponding to cross-sectional views 1200 and 1202 after planarization. The one or more openings 1008 corresponding to a dielectric cut area are located along the second cross-sectional line 1202' (corresponding to cross-sectional view 1202) and removes dielectric material from dielectric lines at positions between active areas. By removing dielectric material from dielectric lines 312 between active areas 304, the subsequently formed self-aligned contacts are isolated in a first direction 910. It will be appreciated the one or more openings 1008 illustrated in FIG. 12B are an example of one or more openings 1008 and in other examples may vary in shape and size.

Figure 13:
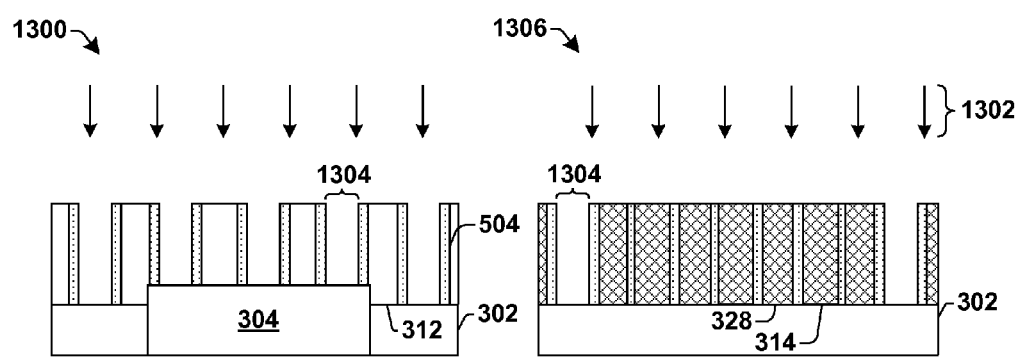
Figure 14:
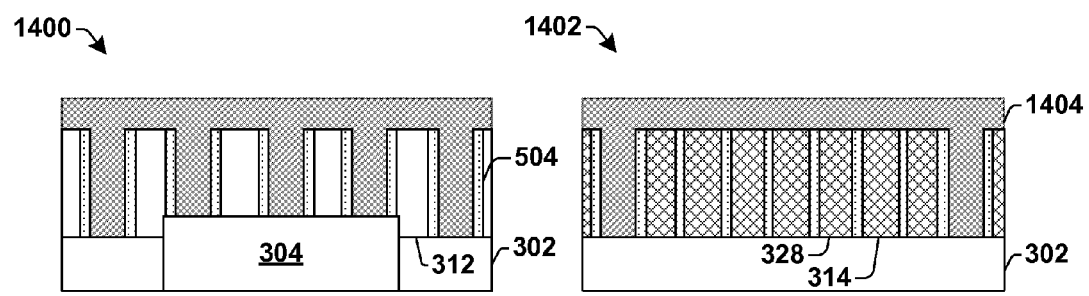

FIG. 13-14 illustrates cross-sectional views of an integrated chip corresponding to act 418.

As shown in cross-sectional views 1300 and 1306, an etchant 1302 is applied to the substrate. The etchant 1302 removes sacrificial gate material from the sacrificial gate lines 502 resulting in a plurality of gate cavities 1304. In some embodiments, the substrate may be selectively etched using a dry etch comprising an etchant comprising a wet etchant or a dry etchant (e.g., Sulfur Hexafluoride).

As shown in cross section views 1400 and 1402 a replacement gate material 1404 is deposited onto the substrate. The replacement gate material 1404 fills the plurality of gate cavities 1304, resulting in gate structures between the dielectric lines 312. In some embodiments, the replacement gate material 1404 may comprise a high-k and/or metal gate material. For example, the replacement gate material 1404 may comprise a metal gate material comprising one or more metal compounds such as Al, Mo, Cu, W, Ti, Ta, etc. The gate electrode can be deposited by way of a vapor deposition process, such as PVD, CVD, PECVD, etc.

Figure 15A:
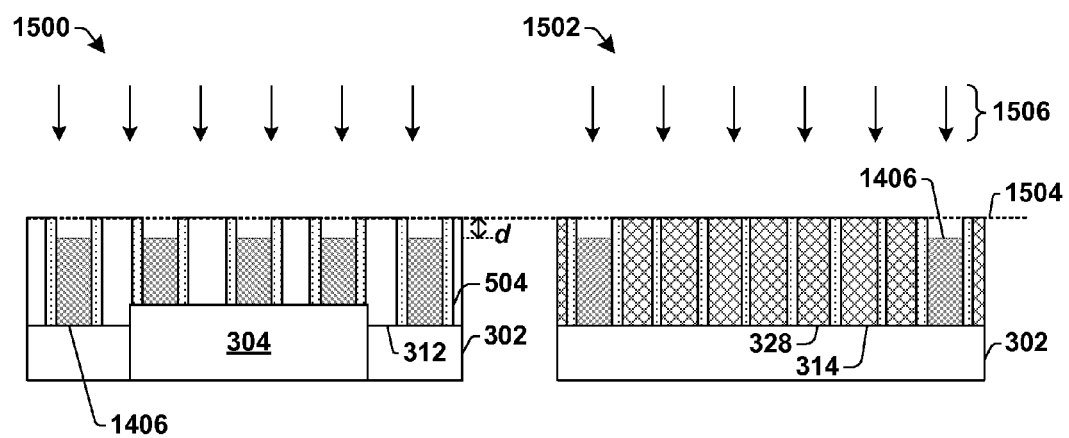

FIG. 15A illustrates cross-sectional views, 1500 and 1502, of an integrated chip corresponding to act 420. As shown in cross-sectional views 1500 and 1502, a CMP process is performed to remove excess material from the substrate and to form a substantially planar surface 1504. An etchant 1506 is then applied to the substrate. The etchant 1506 selectively etches the replacement gate material 1404, to etch back the replacement gate material to form replacement gates 1406 at a position that is below the planar surface 1504 of the substrate by a depth d.

Figure 15B:
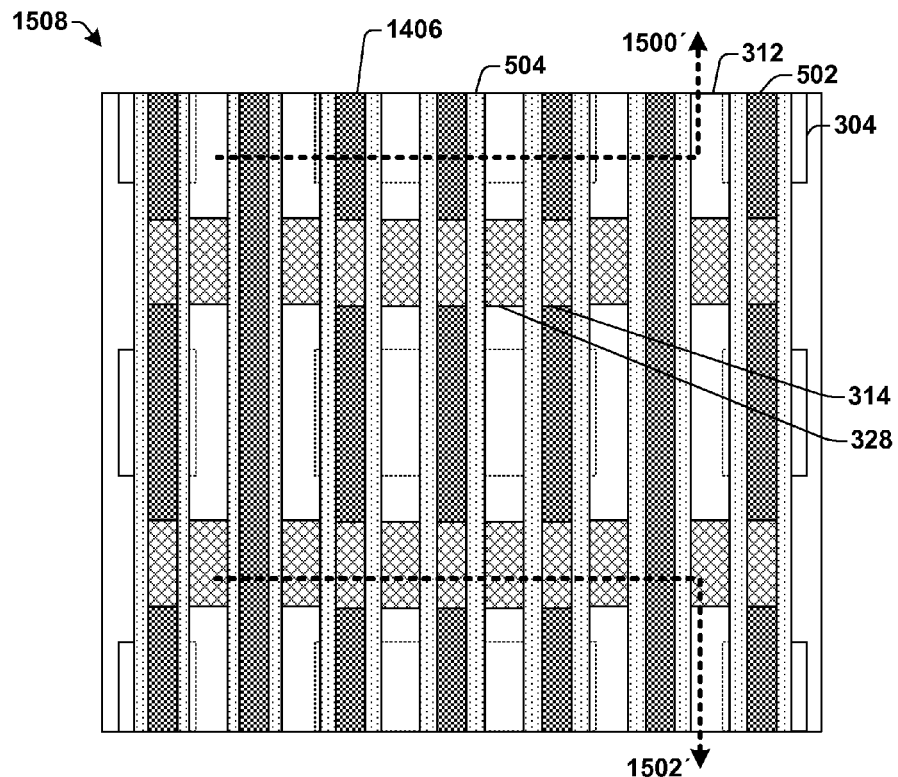

FIG. 15B is a top view 1508 of an integrated chip corresponding to cross-sectional views 1500 and 1502. As shown in top view 1508, the replacement gate 1406 is formed above the active area 304.

Figure 16:
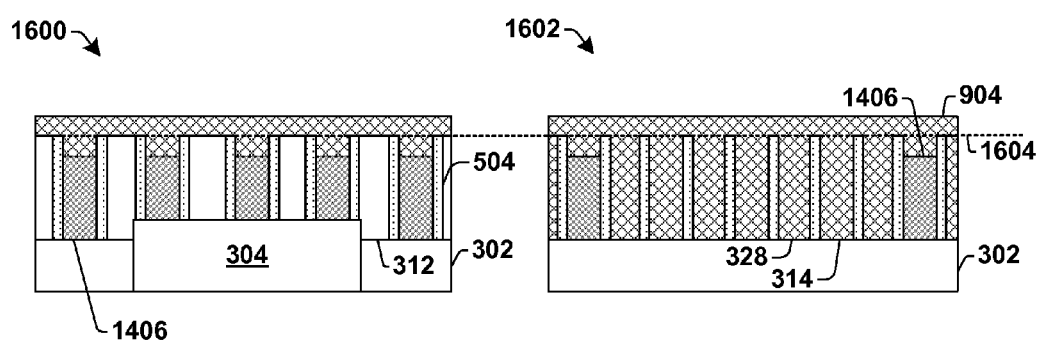

FIG. 16 illustrates cross-sectional views, 1600 and 1602, of an integrated chip corresponding to act 422. As shown in cross-sectional views 1600 and 1602, a dummy isolation material 904 is deposited onto the substrate above the replacement gates 1406. In some embodiments, the dummy isolation material 904 may comprise SiCN deposited by way of deposition process (e.g., a physical vapor deposition such as sputtering). A CMP process is performed to remove excess material from the substrate and to form a substantially planar surface 1604.

Figure 17:
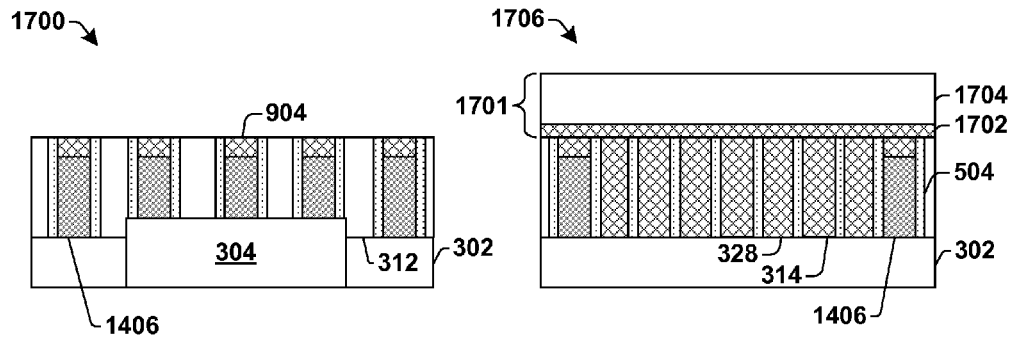

FIG. 17 illustrates cross-sectional views, 1700 and 1706, of an integrated chip corresponding to act 426. As shown in cross-sectional views 1700 and 1706, a third masking layer 1701 is deposited on the substrate. In some embodiments, the third masking layer 1701 comprises a barrier layer 1702 and a photoresist layer 1704. The third masking layer 1701 is patterned to expose the dielectric lines 312 in areas above the active areas 304, without exposing the substrate in areas between the active areas 304.

Figure 18:
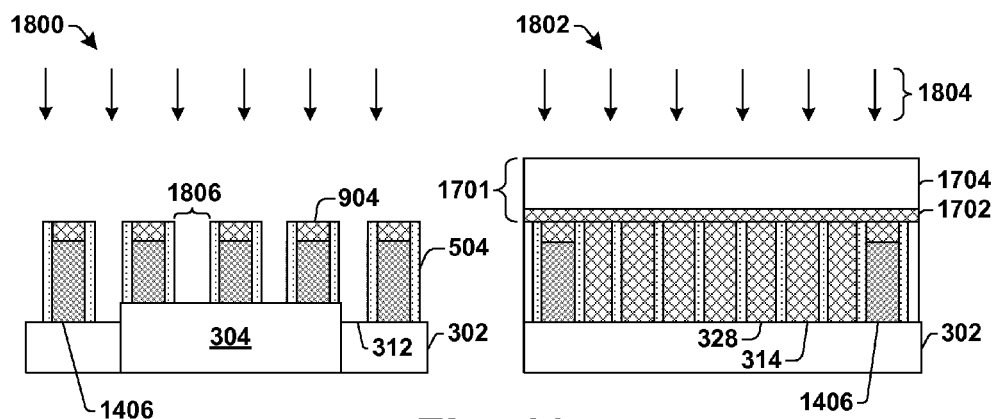

FIG. 18 illustrates cross-sectional views 1800 and 1802, of an integrated chip corresponding to act 428. As shown in cross-sectional views 1800 and 1802, an etchant 1804 is applied to the substrate. The etchant 1804 selectively etches the substrate according to the third masking layer to selectively remove dielectric material from the dielectric lines 312 above the active area 304. Removal of the dielectric material results in a plurality of cavities 1806 in the substrate that are disposed above the active area 304. In some embodiments, the substrate may be selectively etched using a dry etch comprising an etchant comprising CF4 or using a wet etch comprising an etchant comprising KOH, for example.

Figure 19A:
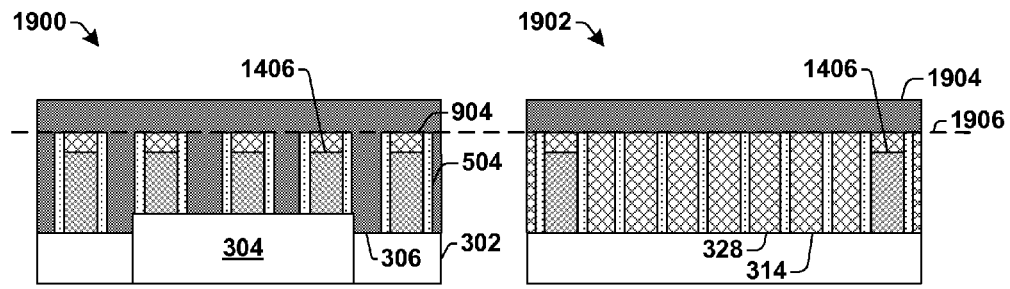

FIG. 19A illustrates cross-sectional views 1900, 1902 of an integrated chip corresponding to act 430. As shown in cross-sectional views 1900 and 1902, a contact metal material 1904 is deposited onto the substrate. The contact metal material 1904 fills the plurality of cavities 1806. In some embodiments, the contact metal material 1904 may comprise tungsten (W) deposited by way of deposition process. After the contact metal material 1904 has been deposited, a chemical mechanical polishing (CMP) process is performed to planarize the substrate, resulting in a substantially flat surface 1906.

Figure 19B:
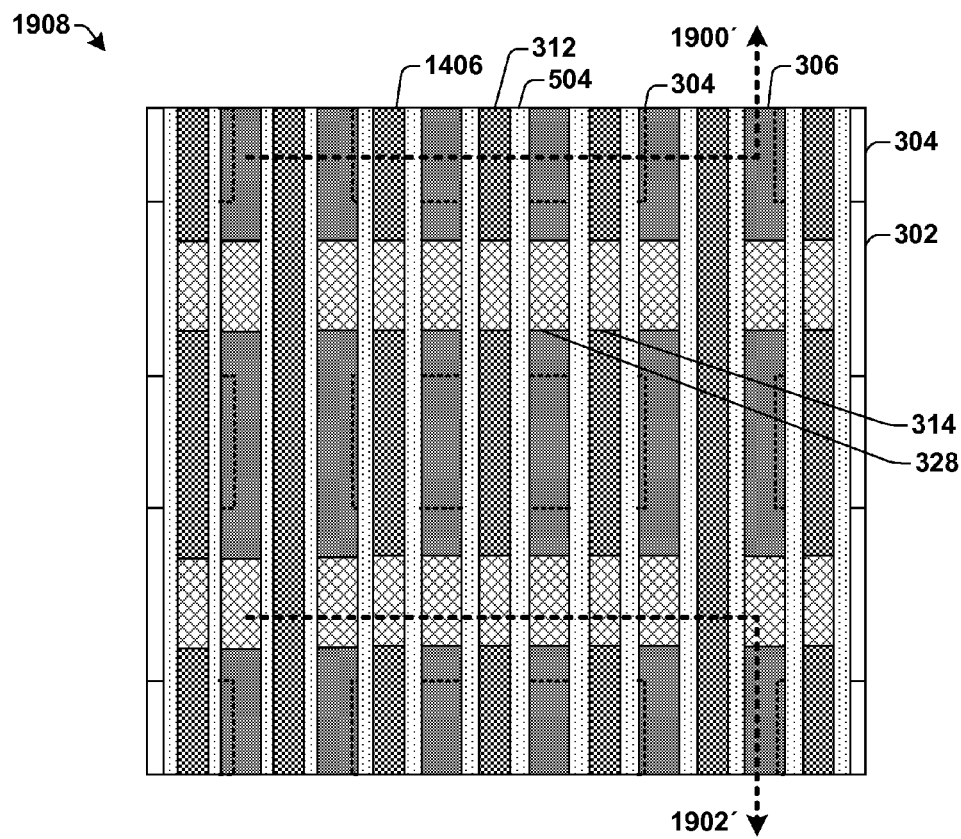

FIG. 19B is a top view 1908 of an integrated chip corresponding to cross-sectional views 1900 and 1902 after planarization. As shown in top view 1908 the self-aligned contacts 306 are formed between replacement gates 1404. By forming the self-aligned contacts 306 between metal gates the metal contacts are do not subject to contact misalignment.

Figure 20:
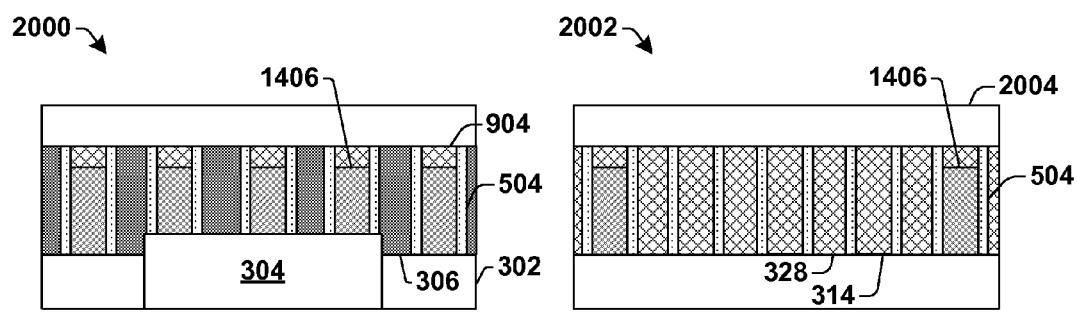

FIG. 20 illustrates cross-sectional views, 2000 and 2002, of an integrated chip corresponding to act 432. As shown in cross-sectional views 2000 and 2002, an inter-level dielectric (ILD) material 2004 is formed on the substrate. In some embodiments, the ILD material 2004 may comprise a low-k dielectric material, such as carbon-doped silicon, borosilicate glass, borophosphosilicate glass, silicon oxycarbide, etc., formed using a deposition process.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of forming a self-aligned contact that mitigates contact etching misalignment.

In some embodiments, the present disclosure relates to a method of forming a self-aligned contact. The method comprises forming a plurality of gate lines interspersed between a plurality of dielectric lines, wherein the gate lines and the dielectric lines extend in a first direction over an active area. The method further comprises cutting one or more of the plurality of gate lines into a plurality of gate line sections aligned in the first direction and cutting one or more of the plurality of dielectric lines into a plurality of dielectric lines sections aligned in the first direction. A dummy isolation material is deposited between adjacent dielectric sections in the first direction and between adjacent gate line sections in the first direction. One or more self-aligned metal contacts are formed by replacing a part of one or more of the plurality of dielectric lines over the active area with a contact metal.

In other embodiments, a method of forming a self-aligned contact. The method comprises forming a plurality of sacrificial gate lines on a semiconductor substrate, wherein the plurality of sacrificial gate lines extend over an active area in a first direction. The method further comprises forming a plurality of dielectric lines interspersed between the plurality of sacrificial gate lines on the semiconductor substrate. The method further comprises selectively removing a part of the sacrificial gate lines and the dielectric lines at a position external to the active area to form a plurality of cavities. A dummy isolation material is deposited into the plurality of cavities and a part of the plurality of dielectric lines are replaced with self-aligned metal contacts above the active area.

In other embodiments, the present disclosure relates to an integrated chip. The integrated chip comprises a plurality of gate lines extending in a first row over one or more active areas. A first dummy isolation material is disposed between adjacent gate lines in the first row. A plurality of self-aligned contacts are interspersed between the gate lines in a second row, adjacent to the first row, at a position over the one or more active areas. A second dummy isolation material is disposed between adjacent self-aligned contacts in the second row.

What is claimed is:
1. A method of forming a self-aligned contact, comprising:
forming a plurality of gate lines interspersed between a plurality of dielectric lines, wherein the gate lines and the dielectric lines extend in a first direction over an active area;
cutting one or more of the plurality of gate lines into a plurality of gate line sections aligned in the first direction;
cutting one or more of the plurality of dielectric lines into a plurality of dielectric lines sections aligned in the first direction;
depositing a dummy isolation material between adjacent dielectric sections in the first direction and between adjacent gate line sections in the first direction; and
forming one or more self-aligned metal contacts by replacing a part of one or more of the plurality of dielectric lines over the active area with a contact metal.

2. The method of claim 1, further comprising:
forming one or more sidewall spacers to abut the gate lines, wherein the one or more sidewall spacers are formed between the gate lines and the dielectric lines in a second direction perpendicular to the first direction.

3. The method of claim 1, wherein cutting one or more of the plurality of gate lines, comprises:
patterning a first masking layer to form one or more openings above the gate lines at positions not above the active area;
selectively etching the gate lines according to the first masking layer to form one or more cavities in the gate lines; and
depositing the dummy isolation material in the one or more cavities in the gate lines.

4. The method of claim 3, wherein the first masking layer comprises:
a silicon carbon nitride (SiCN) layer disposed on the gate lines; and
a photoresist layer disposed on the SiCN layer.

5. The method of claim 3, wherein cutting one or more of the plurality of dielectric lines, comprises:
patterning a second masking layer to form one or more openings above the dielectric lines at positions not above the active area;
selectively etching the dielectric lines according to the second masking layer to form one or more cavities in the dielectric lines; and
depositing the dummy isolation material in the one or more cavities in the dielectric lines.

6. The method of claim 5, wherein replacing dielectric lines with self-aligned metal contacts, comprises:
patterning a third masking layer to form one or more openings above the dielectric lines at positions above the active area;
selectively etching the dielectric lines according to the third masking layer to form one or more contact holes in the dielectric lines; and
depositing the contact metal in the one or more contact holes.

7. The method of claim 1, wherein the plurality of gate lines comprise sacrificial gate lines.

8. The method of claim 7, further comprising:
selectively etching the sacrificial gate lines in a position above the active area to form one or more gate cavities; and
depositing a replacement gate material to fill the one or more gate cavities.

9. The method of claim 8, wherein the replacement gate material comprises a high-k or metal gate material.

10. The method of claim 1, wherein the dummy isolation material comprises silicon carbon nitride (SiCN).

11. A method of forming a self-aligned contact, comprising:
forming a plurality of gate lines interspersed between a plurality of dielectric lines, wherein the gate lines and the dielectric lines extend over first and second active areas;
cutting one or more of the plurality of dielectric lines at a first plurality of positions between the first and second active areas to form a plurality of disjoint dielectric line sections separated by a first plurality of cuts;
cutting one or more of the plurality of gate lines at a second plurality of positions between the first and second active areas to form a plurality of disjoint gate line sections separated by a second plurality of cuts;
depositing a dummy isolation material within the first and second plurality of cuts; and
replacing a part of one or more of the plurality of dielectric lines over the first and second active areas with a contact metal to form one or more self-aligned metal contacts disposed between two of the plurality of gate lines.

12. The method of claim 11, wherein cutting one or more of the plurality of gate lines, comprises:
patterning a first masking layer to form one or more openings above the one or more of the plurality of gate lines at the second plurality of positions;
selectively etching the gate lines according to the first masking layer to form one or more cavities in the gate lines; and
depositing the dummy isolation material in the one or more cavities in the gate lines.

13. The method of claim 11, wherein cutting one or more of the plurality of dielectric lines, comprises:
patterning a second masking layer to form one or more openings above the one or more of the plurality of dielectric lines at the first plurality of positions;
selectively etching the dielectric lines according to the second masking layer to form one or more cavities in the dielectric lines; and
depositing the dummy isolation material in the one or more cavities in the dielectric lines.

14. The method of claim 11, wherein the plurality of gate lines comprise a high-k gate material or a metal gate material.

15. The method of claim 11, wherein replacing the part of the one or more of the plurality of dielectric lines with the contact metal, comprises:
patterning a third masking layer to form one or more openings above the part of the one or more of the plurality of disjoint dielectric line sections at a third plurality of positions over the first and second active areas;
selectively etching the plurality of disjoint dielectric line sections according to the third masking layer to form one or more contact holes in the dielectric lines; and
depositing the contact metal in the one or more contact holes.

16. The method of claim 11, wherein the plurality of gate lines comprise sacrificial gate lines.

17. The method of claim 16, further comprising:
selectively etching the sacrificial gate lines in a fourth plurality of positions over the first and second active areas to form one or more gate cavities; and
depositing a replacement gate material to fill the one or more gate cavities.

18. A method of forming a self-aligned contact, comprising:
forming a plurality of sacrificial gate lines on a semiconductor substrate, wherein the plurality of sacrificial gate lines extend over an active area in a first direction;
forming a plurality of dielectric lines interspersed between the plurality of sacrificial gate lines on the semiconductor substrate;
selectively cutting the sacrificial gate lines and the dielectric lines at a position external to the active area to form a plurality of cuts;
depositing a dummy isolation material into the plurality of cuts; and
replacing a part of the plurality of dielectric lines with self-aligned metal contacts above the active area.

19. The method of claim 18, wherein replacing the part of the plurality of dielectric lines with the self-aligned metal contacts, comprises:

patterning a masking layer to form one or more openings above the dielectric lines at positions above the active area;

selectively etching the dielectric lines according to the masking layer to form one or more contact holes in the dielectric lines; and depositing a contact metal in the one or more contact holes.

20. The method of claim 18, wherein the plurality of gate lines comprise sacrificial gate lines.

\* \* \* \* \*